United States Patent [19]

Imamura et al.

[11] Patent Number: 4,926,433
[45] Date of Patent: May 15, 1990

[54] SEMICONDUCTOR LASER UNIT

[75] Inventors: Tomoatsu Imamura, Isehara; Kazuyuki Shimada, Chofu; Toshitaka Senma, Yokohama, all of Japan

[73] Assignee: Ricoh Company, Ltd., Tokyo, Japan

[21] Appl. No.: 258,479

[22] Filed: Oct. 17, 1988

[30] Foreign Application Priority Data

Oct. 19, 1987 [JP] Japan .................. 62-263042
Nov. 11, 1987 [JP] Japan .................. 62-284676
Dec. 7, 1987 [JP] Japan .................. 62-307442

[51] Int. Cl.$^5$ .................................. H01S 3/19
[52] U.S. Cl. .................................. 372/50; 372/38; 372/29; 357/74; 357/19; 357/75; 357/80
[58] Field of Search .............. 372/38, 43, 56, 29; 357/74, 19, 75, 80

[56] References Cited

U.S. PATENT DOCUMENTS 4,703,334 10/1987 Machimaru et al. ............ 346/160
4,763,334 8/1988 Shimada et al. ................. 372/38

FOREIGN PATENT DOCUMENTS

0034683 2/1984 Japan .................. 372/38
174794 8/1986 Japan .

*Primary Examiner*—William L. Sikes
*Assistant Examiner*—Georgia Y. Epps
*Attorney, Agent, or Firm*—Cooper & Dunham

[57] ABSTRACT

A semiconductor laser unit includes a casing, a printed circuit board fastened to the casing, and a laser diode unit which includes a laser diode and a photodiode for monitoring a laser beam emitted from the laser diode. The laser diode unit is accommodated in the casing. The semiconductor laser unit also includes a monitor output amplifier for amplifying an output signal of the photodiode, and a reference voltage generator for generating a reference voltage signal which is to be compared with an output voltage signal of the monitor output amplifying means in order to set a light intensity of the laser beam to a predetermined value.

8 Claims, 9 Drawing Sheets

SEMICONDUCTOR LASER UNIT

BACKGROUND OF THE INVENTION

The present invention generally relates to a semiconductor laser unit, and in particular to a semiconductor laser unit which is detachably provided, as a light source for optically writing information in a recording medium, into an optical system such as a laser printer, a copier, and a digital fascimile machine.

A semiconductor laser unit is used as a light source and is detachably provided into an optical system such as a laser printer. Generally, a semiconductor laser unit includes a laser diode for emitting a laser beam which has been modulated, and a collimator lens used for changing the emitted laser beam to a parallel laser beam. The parallel laser beam emitted from the semiconductor laser unit passes through scanning means and image-formation means, and scans a photosensitive member such as a photosensitive drum, so that an image can be formed on the photosensitive member on the basis of the principle of electrostatic recording.

A characteristic defined by a relationship described below is an important factor which decides performance of the optical information recording. The above is a relationship between emission power or light intensity of a laser diode and an output voltage of a monitor output amplifier which converts a current signal derived from a photodiode for monitoring light emitted from the laser diode to a voltage signal. Generally, the photodiode is packaged with the laser diode. The above characteristic changes due to variation in an angle of divergence of the laser beam, location and sensitivity of the monitor-use photodiode, and transmittance of the collimator lens. The presence of the above variation causes change of power of the laser beam obtained on the photosensitive drum even when a fixed bias current is applied to the laser diode. For this reason, it becomes necessary to obtain a predetermined light intensity by adjusting the bias current supplied to the laser diode, while monitoring the light intensity of the laser beam by using a power meter, which is placed in a vicinity of the photosensitive drum. It is noted that the bias current is varied by adjusting a variable volume which is mounted on an external printed circuit board which is provided separately from an internal printed circuit board provided into the semiconductor laser unit.

However, the above adjustment must be carried out every time when the semiconductor laser unit being used is replaced with a new one. Therefore, the adjustment is very difficult. Additionally, the adjustment is complex, because the power meter must be actually placed in the vicinity of the photosensitive drum provided in the laser printer. Further, a long time is taken for the adjustment operation. During the operation, the used of the laser printer is prevented.

An improved semiconductor laser unit has been proposed in the Japanese Laid-Open Patent Application No. 61-174794. The proposed semiconductor laser unit includes a monitor output generator consisting of an amplifier and a variable resistor for adjusting gain of the amplifier. The monitor output generator is mounted on the internal printed circuit board included in the semiconductor laser unit. An output signal of the amplifier is supplied, through a cable, to a comparator which is mounted on the external printed circuit board. A reference voltage signal which corresponds to the predetermined light intensity and which is produced by a reference voltage generator mounted on the external printed circuit board, is supplied to the comparator. The bias current to be supplied to the laser diode is adjusted so that the output of the comparator becomes equal to zero, and thereby the light intensity of the laser diode is set to the predetermined light intensity which corresponds to the reference voltage. The adjustment is carried out during a manufacturing process of the laser printer.

However, the proposed semiconductor laser unit has disadvantages described below. Actually, it is difficult to precisely set the reference voltage signal to a predetermined voltage level. In other words, the reference voltage for each laser printer is not identical to each other. Further, it is very difficult to keep the reference voltage signal within a tolerance during long-term use. For example the reference voltage must be kept within a tolerance of $\pm 1\%$ with respect to a reference voltage of 2.5 volts. As a result, when the semiconductor laser diode is replaced with a new one, the gain adjustment of the amplifier is necessary to obtain the predetermined light intensity on the photosensitive drum by using the power meter. In practice, a reference voltage which is generated by an adjustment instrument is supplied to the comparator, in order to facilitate the adjustment operation. However, generally, the reference voltage generated by the adjustment instrument is not equal to the reference voltage generated by the reference voltage generator mounted on the printed circuit board in the laser printer. For this reason, it is actually difficult to adjust the driving current so as to obtain the predetermined light intensity. Moreover, the output signal of the monitor output amplifier is sent to the external circuit provided on the external printed circuit board through a cable connected therebetween. Since the output signal of the monitor output amplifier is an analog signal, it is liable to be affected by the presence of noise.

SUMMARY OF THE INVENTION

Accordingly, a general object of the present invention is to provide a semiconductor laser unit in which the foregoing disadvantages are eliminated.

A more specific object of the present invention is to provide a semiconductor laser unit in which no adjustment operation is necessary when a semiconductor laser unit being used in a laser printer is replaced with a new semiconductor laser unit.

Another object of the present invention is to provide a semiconductor laser unit which is not affected by the presence of noise.

The above objects of the present invention are achieved by a semiconductor laser unit which comprises a casing, a printed circuit board fastened to the casing, and a laser diode unit which includes a laser diode and a photodiode for monitoring a laser beam emitted from the laser diode. The laser diode element is accommodated in the casing. The semiconductor laser unit also includes a monitor output amplifier for amplifying an output signal of the photodiode, and a reference voltage generator for generating a reference voltage signal which is to be compared with an output voltage signal of the monitor output amplifying means in order to set a light intensity of the laser beam to a predetermined value.

Other objects, features and advantages of the present invention will become apparent from the following detailed description when read in conjunction with the accompanying drawings.

DETAILED DESCRIPTION

Figure 1:
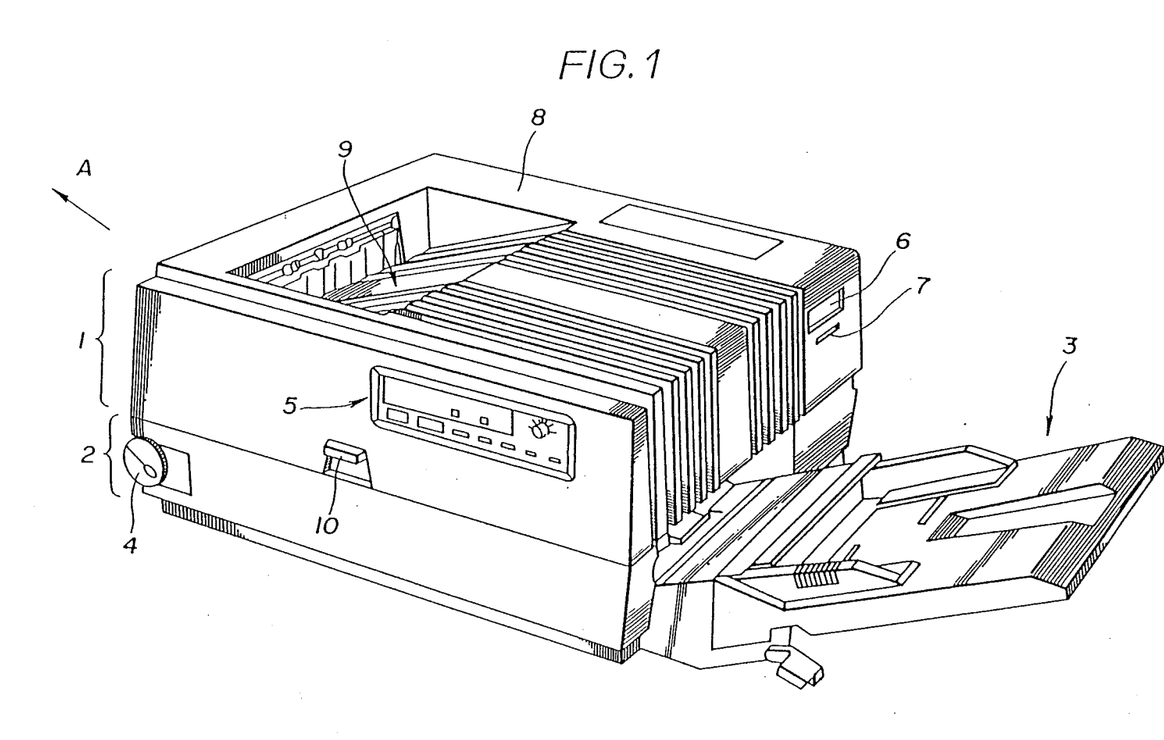
FIG. 1 is a perspective view of a laser printer which employs a semiconductor laser unit of the present invention.

Referring to FIG. 1, a laser printer is generally composed of a printer upper unit 1 and a printer lower unit 2. The printer lower unit 2 is provided with a paper feed tray 3 which is detachably attached thereto for accommodating sheets of paper, and a paper ejection switching knob 4. The printer upper unit 1 is provided with an operation panel 5, a font cartridge inserting entrance 6 and an emulation card inserting entrance 7. An upper paper ejection tray 9 is mounted on an upper plane of a cover 8.

On the operation panel 5, there are disposed switches and the like used for setting various printing conditions including a size of paper. A cartridge (not shown) such as a font cartridge which stores information on the form of a character, is inserted into the font cartridge inserting entrance 6. Information read out from the inserted font cartridge is transferred to a character controller.

The emulation card inserting entrance 7 is used for connecting an emulation card to the character controller. The emulation card is used for interfacing the laser printer and a host computer system (now shown).

The paper ejection switching knob 4 is used for selecting either one of two paper ejection paths. One of them is a path along which the printed paper is ejected towards the upper paper ejection tray 9, and the other is a straight path along which the paper is ejected in a direction of an arrow A.

The printer upper unit 1 and the printer lower unit 2 are hinge-coupled with each other on a rear side of the laser printer, and may be fastened to each other on a front side of the laser printer by means of a lock mechanism (not shown).

Figure 2:
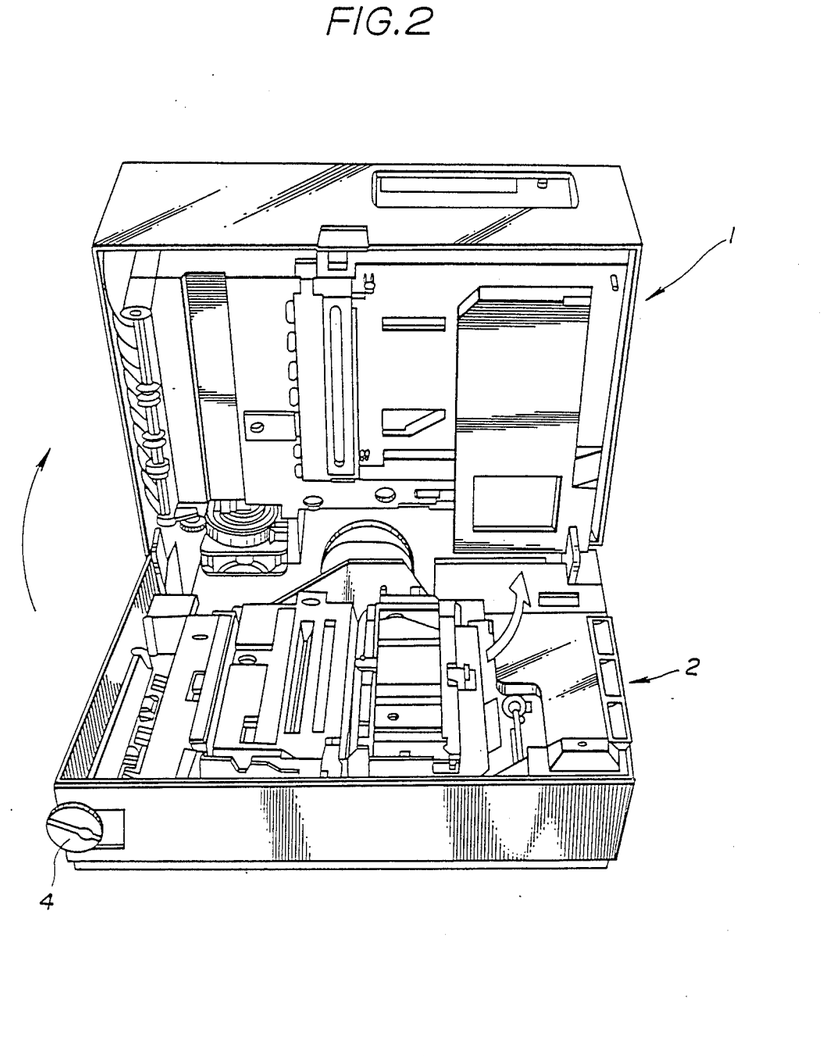
FIG. 2 is a perspective view of the laser printer of FIG. 1, in which a printer upper unit is kept open.

When the lock mechanism is released from a locked state by pushing up a lock lever knob 10 which projects from the front surface of the cover 8, as shown in FIG. 2, the printer upper unit 1 may be driven upwards so as to become apart from the printer lower unit 2. The above mechanism enables easy maintenance operation and easy replacement operation for a photosensitive drum, developing agent and the like.

Figure 3:
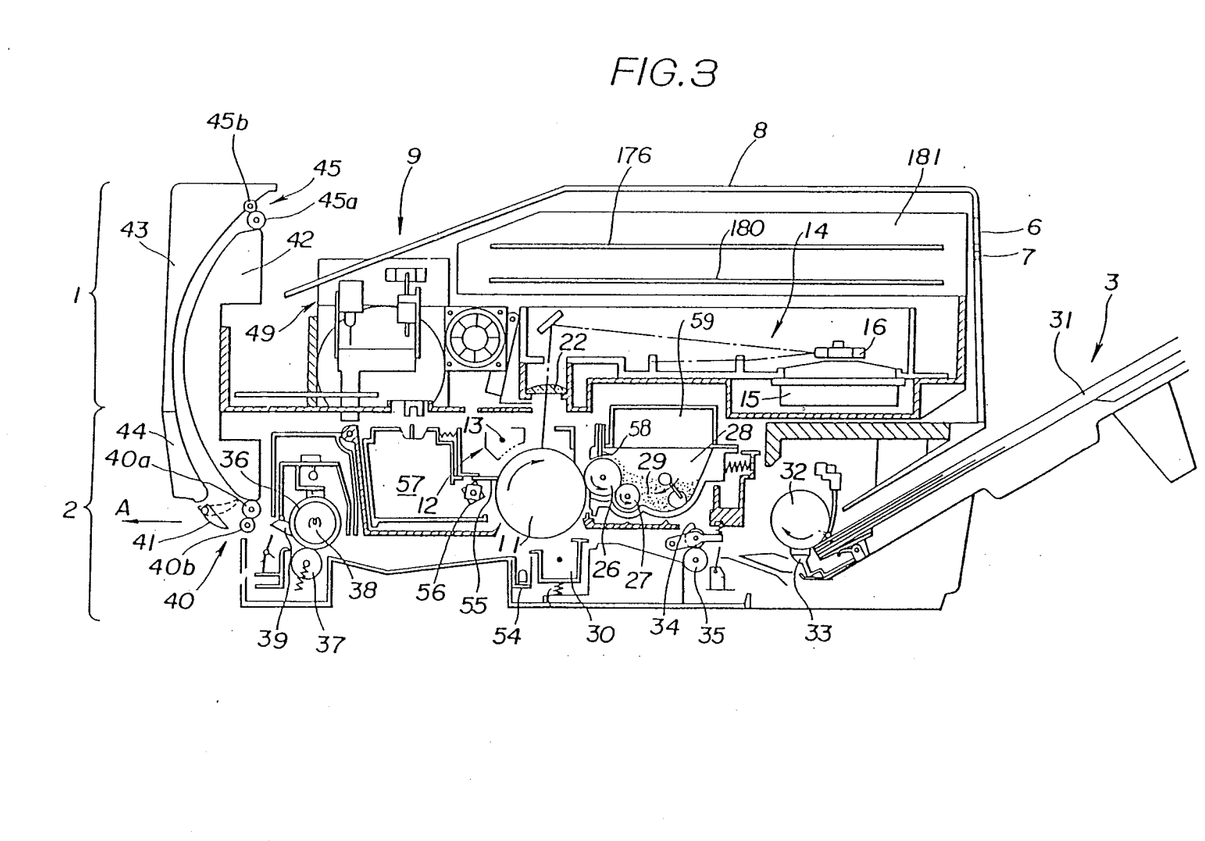
FIG. 3 is a cross sectional view of the laser printer of FIG. 1.

Referring to FIG. 3, a drum-shaped photosensitive member (hereinafter referred to as a photosensitive drum) 11 located generally in the center of the printer lower unit 2 rotates clockwise. At the commencement of operation, the photosensitive drum 11 is subjected to a charge removing process performed by a corona charger 12. A charge wire 13 in the corona charger 12 is stretched in parallel to an axis of the photosensitive drum 11. Atmospheric electric discharge which is raised between the photosensitive drum 11 and the charge wire 13 causes a circumferential surface of the photosensitive drum 11 to be uniformly electrified or charged.

Figure 4:
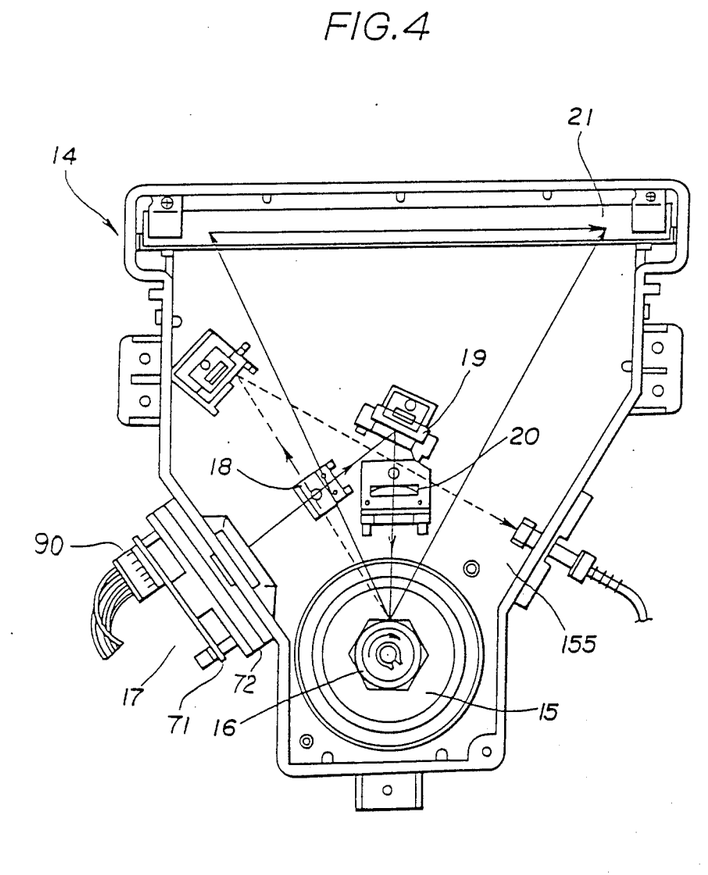
FIG. 4 is a plan view of a laser exposure unit of the laser diode printer of FIG. 1 which employs a preferred embodiment of the present invention.

The photosensitive drum 11 in the charged state is then subjected to an image exposure process carried out by a laser exposure unit 14. As shown in FIG. 4, the laser exposure unit 14 comprises a polygon mirror 16 which is rotated clockwise by a scanner mother 15, a semiconductor laser unit (hereinafter simply referred to as an LD unit) 17, a first cylindrical lens 18, a first mirror 19, a spherical lens 20 and a second mirror 21.

A semiconductor laser diode is built into the LD unit 17, which emits a laser beam which has been modulated by an image signal. As shown in FIG. 4, the laser beam passes through the first cylindrical lens 18 and the first mirror 19, and then enters the spherical lens 20. The laser beam is converged and is slightly refracted upwards by the spherical lens 20, and is then projected onto the polygon mirror 16.

Then the laser beam reflected on the polygon mirror 16 is further reflected on the second mirror 21, and passes through a second cylindrical lens, and is then directed to the photosensitive drum 11. During this operation, the laser beam moves on the second mirror 21 straight due to the rotation of the polygon mirror 16, and thereby the photosensitive drum 11 is scanned in a main scanning direction. The above-mentioned optical scan is repetitively carried out for every plane of the polygon mirror 16. During the optical scan, the photosensitive drum 11 rotates in a direction orthogonal to the main scanning direction, i.e., a sub-scanning direction. As a result, an electrostatic latent image corresponding to the image signal is formed on the peripheral surface of the photosensitive drum 11.

A part of the laser beam reflected on the polygon mirror 16, which is denoted by a broken line in FIG. 4, is used for generating a synchronization pulse signal. The synchronization signal is used for supplying a modulation signal which is an information signal to a laser diode.

Returning to FIG. 3, the electrostatic latent image which is formed on the peripheral surface of the photosensitive drum 11 by the laser exposure unit 14, is transferred on a developing roller 26 during the rotation of the photosensitive drum 11. The developing roller 26 rotates counterclockwise in a state where it is kept in light contact with the peripheral surface of the photosensitive drum 11. During this operation, the developing roller 26 is supplied with toner 29 accommodated in a developing tank 28 by a toner supply roller 27, which is arranged in a bottom portion of the developing tank 28 and rotates counterclockwise. When the electrostatic latent image formed on the peripheral surface of the photosensitive drum 11 is moved up to a position of the developing roller 26, the latent image is developed by the toner supplied by the toner supply roller 27, so that a corresponding visual image is formed.

This toner image thus formed is then moved to an image transfer position opposite to a transfer charger 30. A reference numeral 58 denotes a toner layer thickness limiting blade, and a numeral 59 denotes a toner cartridge.

During the aforementioned operation, a sheet of paper which is a sheet out of stacked sheets of paper 31 and is located at top thereof, is separated from the other stacked sheets by a cooperative function of a paper feed roller 32 rotated in the clockwise direction and a friction pad 33 which is kept in contact with the paper feed roller 32 with a certain pressure. The separated sheet of paper is fed to a contact position of upper and lower transportation rollers 34 and 35, and is further transported to the image transfer position of the photosensitive drum 11.

The transported paper is brought into contact with the toner image formed on the peripheral surface of the photosensitive drum 11 at the image transfer position, and is then discharged by the transfer charger 30. The toner image formed on the photosensitive drum 11 is transferred on the paper due to the discharge function. When the image transfer process is completed, light emitted from a charge removing lamp 54 arranged next to the transfer charger 30 passes through the paper, and is then irradiated onto the peripheral surface of the photosensitive drum 11. Thereby the charge of the photosensitive drum 11 and the charge on the paper are removed by the charge removing lamp 54.

The paper is separated from the photosensitive drum 11 due to its own weight, and is then fed to a heat fixing device equipped with a heating roller 36 and a pressure application roller 37. A pressure is applied to both the upper and lower surfaces of the paper as well as the toner image formed thereon by the cooperating rollers 36 and 37, while being heated by the heating roller 36. Thereby the toner image melts and is fixed on the paper. The heating roller 36 is heated by a heater 38 provided therein.

After the toner image is completely fixed, the paper is peeled from the heating roller 36 by a peeling pawl 39 and is then fed to a paper ejection roller 40. A paper ejection switching pawl 41 is arranged at a downstream position with respect to the paper ejection roller 40. The switching pawl 41 is switchable between the positions indicated by a solid line and a broken line shown in FIG. 3 by turning the paper ejection switching knob 4. When the switching pawl 41 is positioned at the position indicated by the solid line, the paper ejected from the ejection roller 40 moves along a path formed by a paper ejection guide member 42 and paper ejection guide plates 43 and 44, and is then ejected towards the upper ejection tray 9 by the upper ejection roller 45. On the other hand, when the switching pawl 41 is positioned at the position shown by the broken line, the paper from the paper ejection roller 40 is directly ejected in the direction of the arrow A.

Toner which did not contribute to the image transfer and remains on the peripheral surface of the photosensitive drum 11 is scrapped from the peripheral surface of the photosensitive drum 11 by a cleaning blade 55. The scrapped toner is fed to a toner recovery tank 57 by a toner collecting roller 56. The photosensitive drum 11 which has been cleaned by the cleaning blade 55 is electrified again by the corona charger 12.

Figure 5:
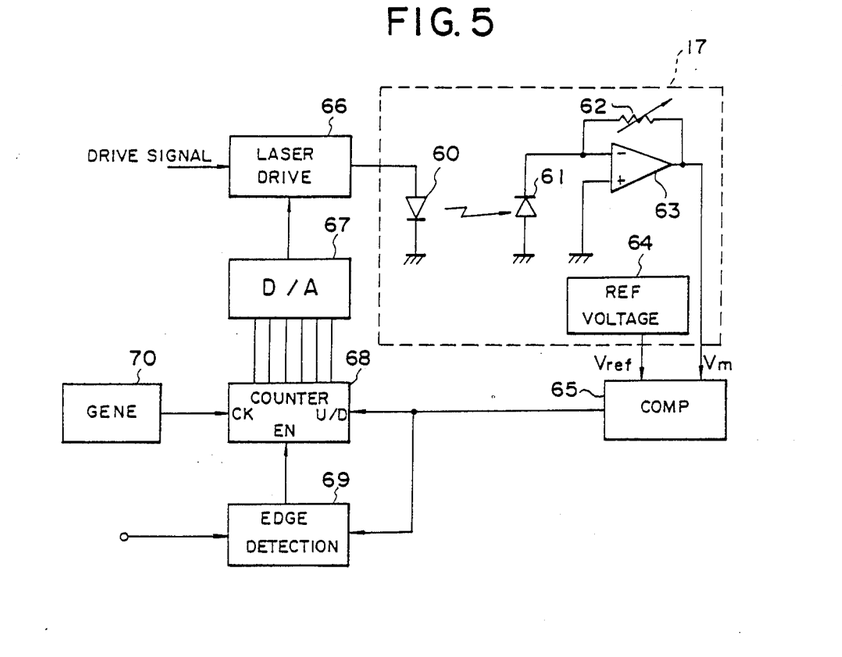
FIG. 5 is a block diagram of a control system for controlling a driving current to be supplied to a laser diode.

A description is given of a control system for controlling a driving current to be supplied to a laser diode included in the LD unit 17 with reference to FIG. 5.

The LD unit 17 includes a semiconductor laser diode 60, a photodiode 61, an operational amplifier 63, a variable resistor 62 for adjusting gain of the amplifier 63, and a reference voltage generator 64. It is noted that the reference voltage generator 64 is included in the LD unit 17, which is clearly distinct from the aforementioned conventional LD unit. Illustrated parts other than the LD unit 17 are provided on a printed circuit board 176 or 180, which is accommodated in the printer upper unit 4 shown in FIG. 3.

In operation, a laser beam emitted backwards from the laser diode 60 is irradiated on the photodiode 61. Generally, the photodiode 61 is packaged in a unit together with the laser diode 60. The photodiode 61 generates a current having a value proportional to the light intensity of the laser beam emitted from the laser diode 60. The current derived from the photodiode 61 is converted to a corresponding voltage Vm by the amplifier 63. The voltage Vm from the amplifier 63 is compared, by a comparator 65, with a reference voltage Vref supplied from the reference voltage generator 64. An output voltage of the comparator 65 varies in polarity depending on a comparison result, and controls a count mode of an up/down counter 68. For example, when the light intensity of the laser beam emitted from the laser diode 60 is similar than a reference intensity, the comparator 65 outputs the output signal which is set to a low level. The low level of the output signal causes the up/down counter 68 to functions as an up counter. An edge detection circuit 69 is used for detecting an edge of the output signal of the comparator 65. When a timing signal T1 is applied to the edge detection circuit 69, the edge detection circuit 69 releases the up/down counter 68 from a disabled state. Then the power setting of the laser diode 60 is activated. That is, the up/down counter 68 increments in response to a clock signal supplied from a generator 70. The count value of the up/down counter 68 is converted to a corresponding analog signal by a digital-to-analog converter (hereinafter referred to as a D/A converter) 67. The analog signal from the D/A converter 67 is supplied to a laser diode driving circuit 66. The laser diode driving circuit 66 drives the laser diode 60 in accordance with a modulation signal, which is supplied from an external circuit (not shown) provided on the printed circuit board 176 or 180. It is noted that a driving current produced by the laser diode driving circuit 66 is varied in accordance with the analog signal derived from the D/A converter 67. As the up/down counter 68 counts an increased value, an increased driving current is applied to the laser diode 60, and thereby the light intensity of the laser beam emitted from the laser diode 60 increases. When the output signal of the comparator 65 is switched from the low level to a high level, the edge detection circuit 69 detects a rising edge of the output signal of the comparator 65. Then the edge detection circuit 69 sets the up/down counter 68 to the disabled state. As a result, the up/down counter 68 is caused to maintain the current count value. Thereby, the driving current from the laser diode driving circuit 66 is fixed to a value corresponding to the maintained count value. In a state where the edge detection circuit 69 releases the up/down counter 68 from the disabled state in response to the timing signal T1, if the output signal of the comparator 65 is kept at the high level, (or in other words, if the light intensity of the light beam emitted from the laser diode 60) is strong, the up/down counter 68 functions as a down counter. Then the down counter 68 discriminates the count value in synchronism with the clock signal derived from the generator 70. Therefore, the output signal of the D/A converter 67 decreases, and correspondingly the driving current decreases. As a result, the output signal of the amplifier 63 decreases. Then the output voltage of the amplifier 63 becomes smaller than the reference voltage Vref, and thereby the output signal of the comparator 65 is switched from the high level to the low level. At this time, the edge detection circuit 69 detects a falling edge of the output signal of the comparator 65, and thereby the up/down counter 68 is set in the disabled state. As a result, the up/down counter 68 is caused to maintain the current count value as it is, and accordingly the driving current from the laser diode driving circuit 66 is fixed to a value corresponding to the maintained count value. The edge detection circuit 69 is designed to cause the up/down counter 68 to be released from the disabled state by the timing signal T1, and to switch the up/down counter 68 in the disabled state only when the output signal of the comparator 65 is changed from the low level to the high level. In a case where the disabled state of the up/down counter 68 is kept released from the disabled state, if the output of the comparator 65 is switched from the low level to the high level, the up/down counter 68 is switched to the disabled state, and maintains the current count value. In a state where the output signal of the comparator 65 is at the high level, and the up/down counter 68 is kept released from the disabled state by the timing signal T1, if the output signal of the comparator 65 is switched from the high level to the low level, the up/down counter 68 functions as the up counter. Then when the driving current for the laser diode 60 increases and then the output signal of the comparator 65 is switched from the low level to the high level, the edge detection circuit 69 detects the rising edge of the output signal of the comparator 65, and sets the up/down counter 68 to the disabled state. As a result, the current count value of the up/down counter 68 is kept as it is. The timing signal T1 is a print end signal which is produced by detecting a rising edge of the aforementioned synchronization signal, which is used in the conventional laser printer.

The variable resistor 62 is served for adjusting the gain of the amplifier 63, and is connected across an output terminal of the amplifier 63 and the inverting input terminal thereof. The variable resistor 62 is adjusted so as to obtain a predetermined light intensity of the laser beam, by using a power meter (now shown) before handing over to a user, the LD unit 17 itself or the laser printer in which the LD unit 17 is built. As will be seen from the described below that the adjustment of the light intensity is unnecessary on a user's side. In the adjustment, the power meter is placed in a vicinity of the laser diode 60 so as to receive the front laser beam irradiated on the photosensitive drum 11. The variable resistor 62 is adjusted so that the output voltage Vm of the amplifier 63 becomes equal to the reference voltage Vref when the power meter indicates a predetermined power. It is noted that a power meter which is used by manufacturers has a very high accuracy. For this reason, the adjustment of the light intensity of the laser beam can be carried out with a high accuracy. Further, when the LD unit is replaced with a new LD unit, it is not necessary to adjust the variable resistor 62 of the LD unit, or in other words, to adjust the light intensity of the laser beam, when the LD unit is replaced with a new LD unit. Therefore, easy replacement operation can be achieved. A cable served for connecting the LD unit 17 and the external circuit formed on the printed circuit boards 176 and 180, can be shortened. Therefore, the LD unit 17 is less affected by the presence of noise, compared with the conventional LD unit. Further, the aforementioned adjustment instrument is unnecessary when the LD diode being used is replaced with a new one. Variation in light-emitting characteristics of the laser diode 60 can be compensated within the laser unit 17. In other words, the light intensity of the laser beam is adjusted on the basis of the reference voltage Vref which is generated in the LD unit 17. On the other hand, the conventional LD unit does not have the reference voltage generator therein. For this reason, when the LD unit is replaced with a new LD unit, the variable resistor 62 in the conventional LD unit must be adjusted by using the power meter so as to obtain the light intensity of the laser beam.

Figure 6:
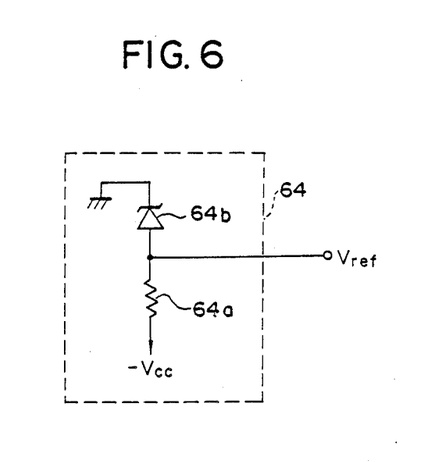
FIG. 6 is a circuit diagram of a reference signal generator.

An example of the circuit configuration of the reference voltage generator 64 is illustrated in FIG. 6. The illustrated circuit includes a resistor 64a and a Zener diode 64b. An end of the resistor 64a is connected to a negative power source −Vcc, and the other end thereof is connected to an anode of the Zener diode 64b. The other end of the Zener diode 64b is connected to ground. The reference voltage Vref is extracted from a node of the resistor 64a and the Zener diode 64b.

Figure 7:
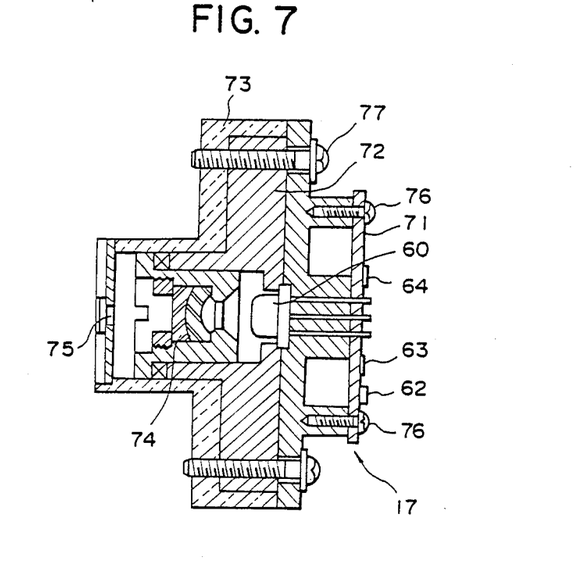
FIG. 7 is a cross sectional view of a semiconductor laser unit of the preferred embodiment of the present invention.

FIG. 7 shows a cross section of the LD unit 17. Referring to FIG. 7, a printed circuit board 71 is secured to projection portions of a metallic base 72, which is used for supporting the laser diode 60 by screws 76. An insulating member 73 is mounted on a surface of the metallic base 72 so as to surround the laser diode 60. The insulating member 73, which is served as a casing, is secured to the metallic base 72 by screws 77. A collimator lens 74 supported by the metallic base 72 is provided on the front side of the laser diode 60. The collimator lens 74 is directed to converging the divergent laser beam to a parallel laser beam. The parallel laser beam from the collimator lens 74 passes through an aperture 75 which functions to shape the laser beam. The variable resistor 62, the amplifier 63 and the reference voltage generator 64 are mounted on the printed circuit board 71. It is particularly noted that the reference voltage generator 64 is provided on the printed circuit board 65, and is one of components which construct the LD unit 17.

As shown in FIG. 7, the LD unit 17 includes the collimator lens 74. This structure has an additional advantage in which optical characteristics of the collimator lens 74 can be compensated by the adjustment of the variable resistor 62. Alternatively, an LD unit in which the collimator lens 74 is not included, may be provided. The important matter is that the reference voltage generator 64 is included in the LD unit 17.

Figure 8:
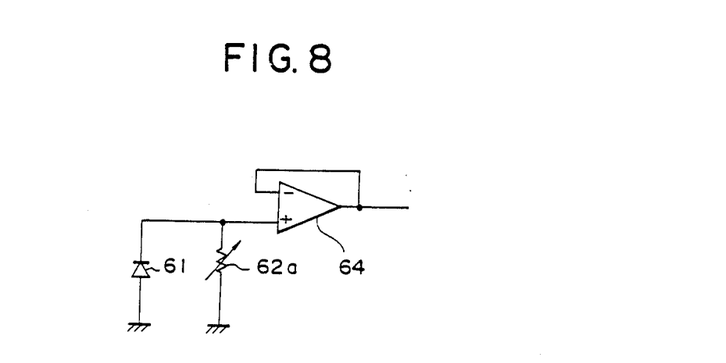
FIG. 8 is a circuit diagram of another circuit configuration of a monitor output amplifying circuit which consists of an amplifier and a variable resistor.

In place of the variable resistor 62, a variable resistor 62a shown in FIG. 8 may be used. The variable resistor 62a is connected between the non-inverting input terminal of the amplifier 64 and the ground. The output terminal of the amplifier 64 is connected directly to the inverting input terminal thereof. The variable resistor 62a has a similar function to the variable resistor 62.

A description is given of another embodiment of the present invention. An essential feature of another embodiment (second embodiment) is that the comparator 65 shown in FIG. 5 is mounted on the printed circuit board 71 of the LD unit 17. It is noted that in the structure of FIG. 5, the comparator 65 is mounted on the printed circuit board 176 or 180. The output terminals of the amplifier 63 and the reference voltage generator 64 are connected to the comparator 65 mounted on the printed circuit board 176 or 180 by a cable (not shown). The output signals Vm and Vref of the amplifier 63 and the reference voltage generator 64 are analog signals. Therefore, the output signals Vm and Vref are liable to be affected by noise, and may be varied. On the other hand, the output signal of the comparator 65 is a binary output signal, which is not affected by noise. An interconnection between the amplifier 63, the reference signal generator 64 and the comparator 65 can be shortened. From the above viewpoints, it is preferable to mount the comparator 65 on the printed circuit board 71 of the LD unit 17. The embodiment of FIG. 9 is not affected by the presence of noise.

Figure 9:
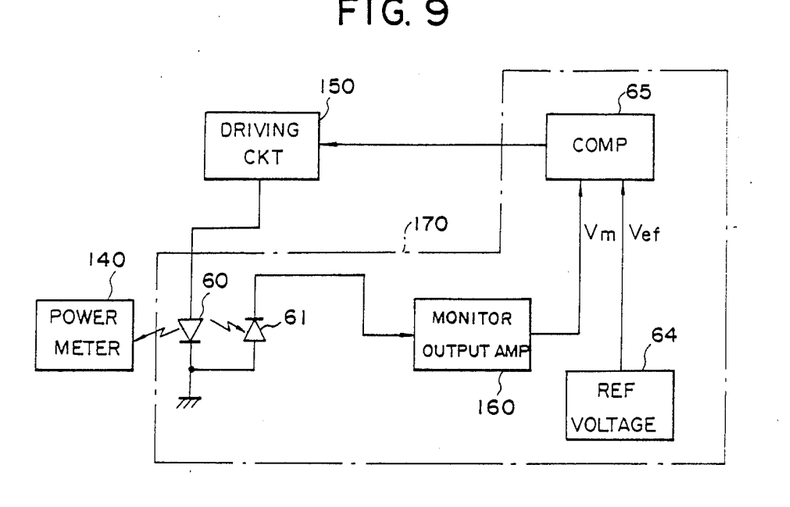
FIG. 9 is a circuit diagram of a semiconductor laser unit provided by another preferred embodiment of the present invention.

The second embodiment is illustrated in FIG. 9. An LD unit 170 includes the laser diode 60, the photodiode 61, a monitor output amplifier 160, the reference voltage generator 64 and the comparator 65. The monitor output amplifier 160 consists of the variable resistor 62 and the amplifier 63 shown in FIG. 5. A driving circuit 150 includes the laser diode driving circuit 66, the D/A converter 67, the up/down counter 68, the edge detection circuit 69 and the generator 70. A block 140 is a power meter, which is used when the light intensity of the laser beam emitted from the laser diode 60 is adjusted.

Figure 10:
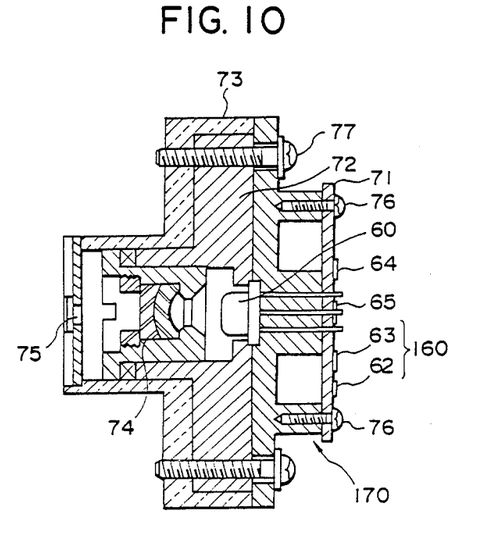
FIG. 10 is a cross sectional view of the semiconductor laser unit of FIG. 9.

FIG. 10 is a cross sectional view of the LD unit 170 of FIG. 9. Those parts which are the same as those in FIG. 7 are given the same reference numerals. As shown in FIG. 10, the comparator 65 is mounted on the printed circuit board 71.

Figure 11A:
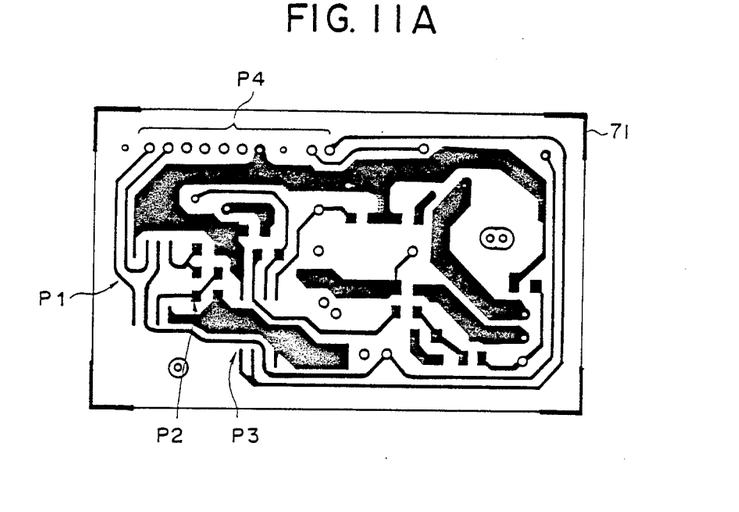
FIGS. 11a and 11b are views of a printed circuit board included in the semiconductor laser unit of FIG. 9.
Figure 11B:
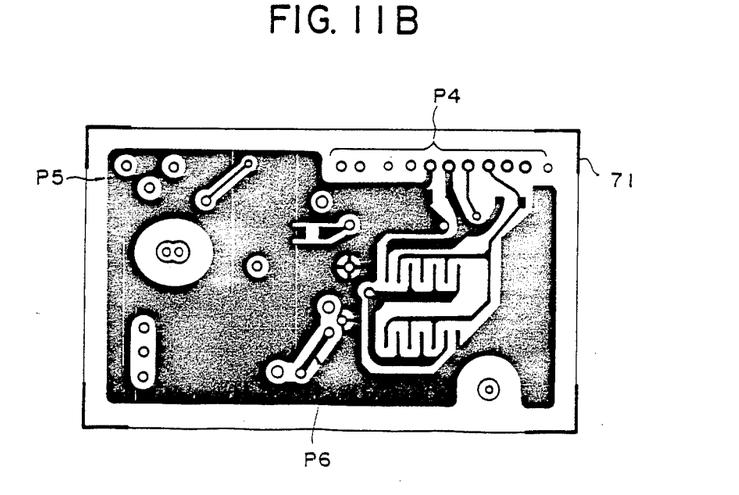

FIGS. 11a and 11b show patterns of the printed circuit board 71 of the LD unit 170, which are formed on soldering and component sides thereof, respectively. The comparator 65 and the reference voltage generator 64 are located in areas P1 and P2, respectively. The variable resistor 62 and the amplifier 63 are located in areas P3 and P5, respectively. A plurality of connector terminals for establishing connections with the external circuit are located in an area P4. A connector 90 shown in FIG. 4 may be mounted on the connector terminals formed in the area P4. The laser diode 60 is located in an area P6. The variable resistor 62 is constituted by a chip resistor (1/10 W). The aforementioned LD units 17 and 170 are not provided with a modulation circuit which produces the modulation signal to be applied to the laser driving circuit 66 or the driving circuit 150. Alternatively, the modulation circuit may be mounted on the printed circuit board 71 of the LD unit 17 or 170.

In the foregoing embodiments, the reference voltage generator 64 produces a single reference voltage signal Vref. Alternatively, two reference voltage signals may be used for controlling the light intensity of the laser beam emitted from the laser diode 60 so that the light intensity is within a light intensity range defined by the references. A laser diode driving system that uses two reference voltage signals, are disclosed in the U.S. Pat. No. 98,603 (now allowed), the disclosure of which is hereby incorporated by reference. In the case where the two reference voltage signals Vref1 and Vref2 are used, the comparator 65 consists of two comparators. The first comparator compares the output voltage Vm with the reference voltage Vref1, and the second comparator compares the output voltage Vm with the reference voltage Vref2. Up/down counters are provided for the respective comparators, and control the laser diode driving circuit 66 in accordance with the comparison results in the comparators.

Figure 12A:
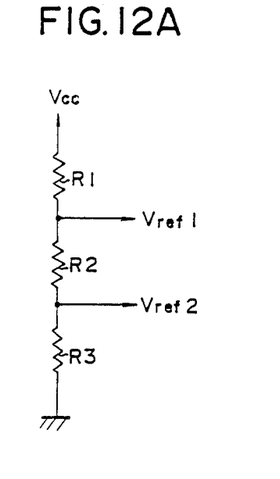
FIGS. 12a and 12b are circuit diagrams of circuit structures of the reference voltage generator.

FIG. 12a shows a circuit of the reference signal generator which produces two reference voltage signals Vref1 and Vref2. The illustrated circuit consists of three resistors which are connected in series. An end of the resistor R1 is connected to a positive power source Vcc, and an end of the resistor R3 is connected to the ground. The reference voltage signal Vref1 is extracted from a node of the resistors R1 and R2. The reference voltage signal is extracted from a node of the resistors R2 and R3. The circuit of FIG. 12 is mounted on the printed circuit board 71.

Figure 12B:
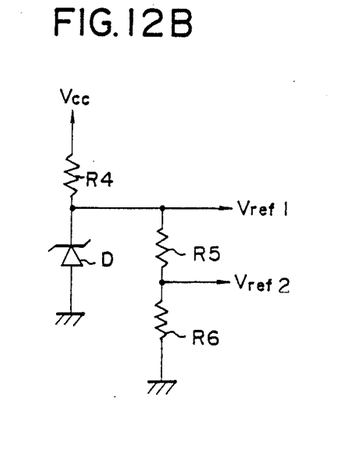

FIG. 12b shows another circuit of the reference signal generator which produces two reference voltage signals Vref1 and Vref2. The circuit consists of three resistors R4 through R6 and a Zener diode D. An end of the resistor R4 is connected to the positive power source Vcc, and the other end thereof is connected to a cathode terminal of the Zener diode D. An anode of the Zener diode D is connected to the ground. The reference voltage signal Vref1 is extracted from a node of the resistor R4 and the Zener diode D. Series-connected resistors R5 and R6 are connected across the node and the ground. The reference voltage signal Vref2 is extracted from a node of the resistors R5 and R6.

The present invention is not limited to the foregoing embodiments, and variations and modifications may be made without departing from the scope of the present invention.

What is claimed is:

1. A semiconductor laser unit comprising:
   a casing having a front portion including an aperture, and a rear portion having mounting projections;
   a printed circuit board fastened to said mounting projections of said rear portion of said casing;
   a laser diode unit comprising a laser diode emitting a laser beam forward and backward, and a photodiode for monitoring the laser beam emitted backward from said laser diode unit being accommodated in said casing and providing an output signal, said laser beam emitted forward from said laser diode passing through said aperture of said front portion;
   monitor output amplifying means, mounted on said printed circuit board, for amplifying said output signal of said photodiode to provide an output voltage signal; and
   reference voltage generating means, mounted on said printed circuit board, for generating a reference voltage, signal which is to be compared with said output voltage signal of said monitor output amplifying means in order to set the light intensity of the laser beam to a predetermined value.

2. A semiconductor laser unit as claimed in claim 1, further comprising voltage comparing means, mounted on said printed circuit board, for comparing said output voltage signal of said monitor output amplifying means with the reference voltage signal, wherein a comparison result is used for controlling the light intensity of the laser beam emitted from said laser diode.

3. A semiconductor laser unit as claimed in claim 1, wherein the monitor output amplifying means comprises an operational amplifier and a variable resistor which is connected across an output terminal of the operational amplifier and an inverting input terminal thereof, and wherein the output signal from the photodiode is supplied to the non-inverting input of the operational amplifier, and a non-inverting input terminal of the operational amplifier is connected to ground.

4. A semiconductor laser unit as claimed in claim 1, wherein the monitor output amplifying means comprises an operational amplifier and a variable resistor which is connected between an non-inverting input terminal of the operational amplifier and ground, and wherein the output signal from the photodiode is supplied to the non-inverting input terminal of the operational amplifier, and an inverting input terminal of the operational amplifier is connected to an output terminal of the operational amplifier.

5. A semiconductor laser unit as claimed in claim 1, wherein the reference voltage generating means comprises a Zener diode and a resistor, and wherein a cathode of the Zener diode is connected to ground, and an anode thereof is connected to an end of the resistor, and wherein the other end of the resistor is connected to a negative power source, and wherein the reference voltage signal is extracted from a node of the Zener diode and the resistor.

6. A semiconductor laser unit comprising:
a casing having a front portion including an aperture, and a rear portion having mounting projections;
a printed circuit board fastened to the mounting projections of said rear portion of said casing;
a laser diode unit comprising a laser diode emitting a laser beam forward and backward, and a photodiode for monitoring the laser beam emitted backward from said laser diode, said laser diode unit being accommodated in said casing and providing an output signal, said laser beam emitted forward from said laser diode passing through said aperture of said front portion;
monitor output amplifying means, mounted on said printed circuit board, for amplifying said output signal of said photodiode to provide an output voltage signal; and
reference voltage generating means, mounted on said printed circuit board, for generating first and second reference voltage signals which are to be compared with said output voltage signal of said monitor output amplifying means in order to set the light intensity of said laser beam within a predetermined range defined by said first and second reference voltage signals.

7. A semiconductor laser unit as claimed in claim 6, wherein the reference voltage generating means comprises first, second and third resistors which are connected in series, and wherein the first reference voltage signal is extracted from a node of the first and second resistors, and the second reference voltage signal is extracted from a node of the second and third resistors.

8. A semiconductor laser unit as claimed in claim 6, wherein the reference voltage generating means comprises first, second and third resistors, and a Zener diode, and wherein an end of the first resistor is connected to a cathode of the Zener diode, and a node of the first resistor and the Zener diode is connected to an end of the second resistor, and wherein the other end of the second resistor is connected to an end of the third resistor, and wherein the first reference voltage signal is extracted from the node of the first resistor and the Zener diode, and the second reference voltage signal is extracted from a node of the second and third resistors.

* * * * *